(12) United States Patent
Kato

(10) Patent No.: US 6,403,927 B1
(45) Date of Patent: Jun. 11, 2002

(54) HEAT-PROCESSING APPARATUS AND METHOD OF SEMICONDUCTOR PROCESS

(75) Inventor: Kazuhiko Kato, Esashi (JP)

(73) Assignee: Toda Kogyo Corporation, Hiroshima-ken (JP)

( * ) Notice: Subject to any disclaimer, the term of this patent is extended or adjusted under 35 U.S.C. 154(b) by 0 days.

(21) Appl. No.: 09/932,942

(22) Filed: Aug. 21, 2001

(30) Foreign Application Priority Data

Aug. 23, 2000 (JP) ........................................ 2000-252249

(51) Int. Cl.[7] .................................................. F27B 5/14
(52) U.S. Cl. ........................ 219/390; 219/405; 219/411; 392/416; 392/418; 118/724; 118/725
(58) Field of Search ................................. 219/390, 405, 219/411; 118/724, 725, 50.1; 392/416, 418

(56) References Cited

U.S. PATENT DOCUMENTS

| | | | | |
|---|---|---|---|---|
| 5,378,283 A | * | 1/1995 | Ushikawa | 118/719 |
| 5,676,869 A | * | 10/1997 | Nakayama et al. | 219/390 |
| 6,005,225 A | * | 12/1999 | Kowalski et al. | 219/390 |
| 6,031,205 A | * | 2/2000 | Shimazu | 219/390 |
| 6,198,075 B1 | * | 3/2001 | Moffat | 219/390 |

FOREIGN PATENT DOCUMENTS

| | | |
|---|---|---|
| JP | 7-6955 | 1/1995 |
| JP | 7-99164 | 4/1995 |

* cited by examiner

Primary Examiner—Teresa Walberg
Assistant Examiner—Shawntina T. Fuqua
(74) Attorney, Agent, or Firm—Nixon & Vanderhye

(57) ABSTRACT

A vertical heat-processing apparatus includes a surrounding member, which surrounds a process chamber and a heater. The surrounding member forms a heating space around the process chamber. The heating space has zones juxtaposed in a vertical direction. Temperature sensors are arranged to detect temperatures respectively representing the zones. Supply pipes are arranged to respectively supply a cooling gas to the zones. The supply pipes are respectively provided with valves controlled by a controller. The controller adjusts opening degrees of the valves such that a flow velocity of the cooling gas in a first zone having a lower cooling rate becomes higher than a flow velocity of the cooling gas in a second zone having a higher cooling rate used as a reference.

20 Claims, 3 Drawing Sheets

HEAT-PROCESSING APPARATUS AND METHOD OF SEMICONDUCTOR PROCESS

CROSS-REFERENCE TO RELATED APPLICATIONS

This application is based upon and claims the benefit of priority from the prior Japanese Patent Application No. 2000-252249, filed Aug. 23, 2000, the entire contents of which are incorporated herein by reference.

BACKGROUND OF THE INVENTION

1. Field of the Invention

The present invention relates to a heat-processing apparatus and method for a semiconductor process in which a plurality of target substrates are subjected to a heat-process simultaneously, i.e., together at the same time. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

2. Description of the Related Art

In the semiconductor process, a vertical heat-processing apparatus is known as a batch type processing apparatus that applies heat processes, such as oxidation, diffusion, annealing, and CVD, to a number of semiconductor wafers together at the same time. The vertical heat-processing apparatus is used such that a number of wafers are arrayed and held with a gap therebetween in a vertical direction in a holder called a wafer boat, and then the holder is loaded into a process chamber of a vertical type. Then, the wafers are subjected to a heat process while they are heated by a heating mechanism disposed around the process chamber.

The heating mechanism includes a surrounding member formed of a cylindrical heat-insulating body, which forms a heating space around the process chamber. A resistance heating wire (heater) is disposed on the inner surface of the surrounding member. Preferably, the heating space comprises a plurality of zones arrayed in a vertical direction, and the heater comprises a plurality of heater segments corresponding to the zones. The heater segments can be controlled independently of each other, so that a heat process is performed uniformly over all the zones.

The heating mechanism is arranged to perform a cooling operation by natural cooling or forcible cooling, which is performed by gas cooling or liquid cooling. As shown in FIG. 5, when the heating mechanism is cooled, the cooling rates of the zones tend to be uneven due to heat discharge and the like. Generally, the cooling rates of the lower and upper zones of the heating space are higher than that of the middle zone. Such unevenness in the cooling rate makes the thermal budgets of wafers in one lot different from each other.

The cooling rate of the heating space is set when the heat-processing apparatus is first installed, using a method so as to adjust the rate of a zone, which tends to have a higher rate, to be closer to the rate of a zone, which tends to have a lower rate. In an apparatus of the natural cooling type, the apparatus is set such that, for example, the heater segments of the lower and upper zones are supplied with a voltage to decrease their cooling rates down to a value as low as the middle zone. In this case, the heat applied to the lower zone warms the middle zone due to convection, radiation, and conduction of the heat, resulting in a decrease in the cooling rate as a whole.

On the other hand, when an apparatus of the forcible cooling type is installed, supply rates of a cooling gas to the zones are adjusted in order to set the cooling rate of the heating space such that the cooling rate of the middle zone becomes almost the same as those of the lower and upper zones. In this case, it is necessary to perform a troublesome operation of repeatedly adjusting manual valves on air supply pipes while confirming the cooling rates of the zones.

BRIEF SUMMARY OF THE INVENTION

An object of the present invention is to provide a heat-processing apparatus and method for a semi-conductor process, which prevent the cooling rates of the zones of a heating space from differing from each other, and increase the cooling rate of the heating space as a whole.

Another object of the present invention is to provide a heat-processing apparatus and method for a semiconductor process, which does not entail the troublesome operation for setting the cooling rate of a heating space when the apparatus is installed.

According to a first aspect of the present invention, there is provided a heat-processing apparatus for a semiconductor process in which a plurality of target substrates are simultaneously subjected to a heat-process, the apparatus comprising:

a process chamber, which accommodates the target substrates;

a holder, which holds the target substrates with a gap therebetween in the process chamber;

a heater disposed around the process chamber, which heats an interior of the process chamber through a sidewall of the process chamber;

a surrounding member, which surrounds the process chamber and the heater, and forms a heating space around the process chamber, the heating space comprising a plurality of zones juxtaposed in a direction in which the target substrates are arrayed;

a plurality of the temperature sensors, which detect temperatures respectively representing the zones;

a cooling mechanism, which forms flows of a cooling gas respectively in the zones, and cools the zones; and a controller, which controls the cooling mechanism on the basis of temperatures detected by the temperature sensors when the process chamber is cooled, such that a flow velocity of the cooling gas in a first zone having a lower cooling rate becomes higher than a flow velocity of the cooling gas in a second zone having a higher cooling rate used as a reference, thereby adjusting the cooling rate of the first zone to be closer to the cooling rate of the second zone.

According to a second aspect of the present invention, there is provided a heat processing method in the apparatus according to the first aspect, comprising:

subjecting the target substrates to a heat process, in which the target substrates are held by the holder in the process chamber, and heated by the heater;

performing, after the heat process, a cooling operation to cool the process chamber, in which the controller controls the cooling mechanism on the basis of temperatures detected by the temperature sensors, such that a flow velocity of the cooling gas in a first zone having a lower cooling rate becomes higher than a flow velocity of the cooling gas in a second zone having a higher cooling rate used as a reference, thereby adjusting the cooling rate of the first zone to be closer to the cooling rate of the second zone.

According to a third aspect of the present invention, there is provided a vertical heat-processing apparatus for a semiconductor process in which a plurality of target substrates are simultaneously subjected to a heat-process, the apparatus comprising:

a process chamber, which accommodates the target substrates;

a supply section, which supplies the process gas into the process chamber;

an exhaust section, which exhausts the process chamber;

a holder, which holds the target substrates in the process chamber such that they are stacked one on the other with a gap therebetween in a vertical direction;

a heater disposed around the process chamber, which heats an interior of the process chamber through a sidewall of the process chamber;

a surrounding member, which surrounds the process chamber and the heater, and forms a heating space around the process chamber, the heating space comprising a plurality of zones juxtaposed in a vertical direction;

a plurality of the temperature sensors, which detect temperatures respectively representing the zones;

a cooling mechanism, which forms flows of a cooling gas respectively in the zones, and cools the zones, the cooling mechanism comprising a plurality of supply pipes, which respectively supply the cooling gas to the zones to cool the zones, a plurality of valves respectively arranged on the supply pipes to adjust supply rates of the cooling gas to the zones, and an exhaust pipe, which exhausts the cooling gas from the zones; and a controller, which adjusts opening degrees of the valves on the basis of temperatures detected by the temperature sensors when the process chamber is cooled, such that a flow velocity of the cooling gas in a first zone having a lower cooling rate becomes higher than a flow velocity of the cooling gas in a second zone having a higher cooling rate used as a reference, thereby adjusting the cooling rate of the first zone to be closer to the cooling rate of the second zone.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
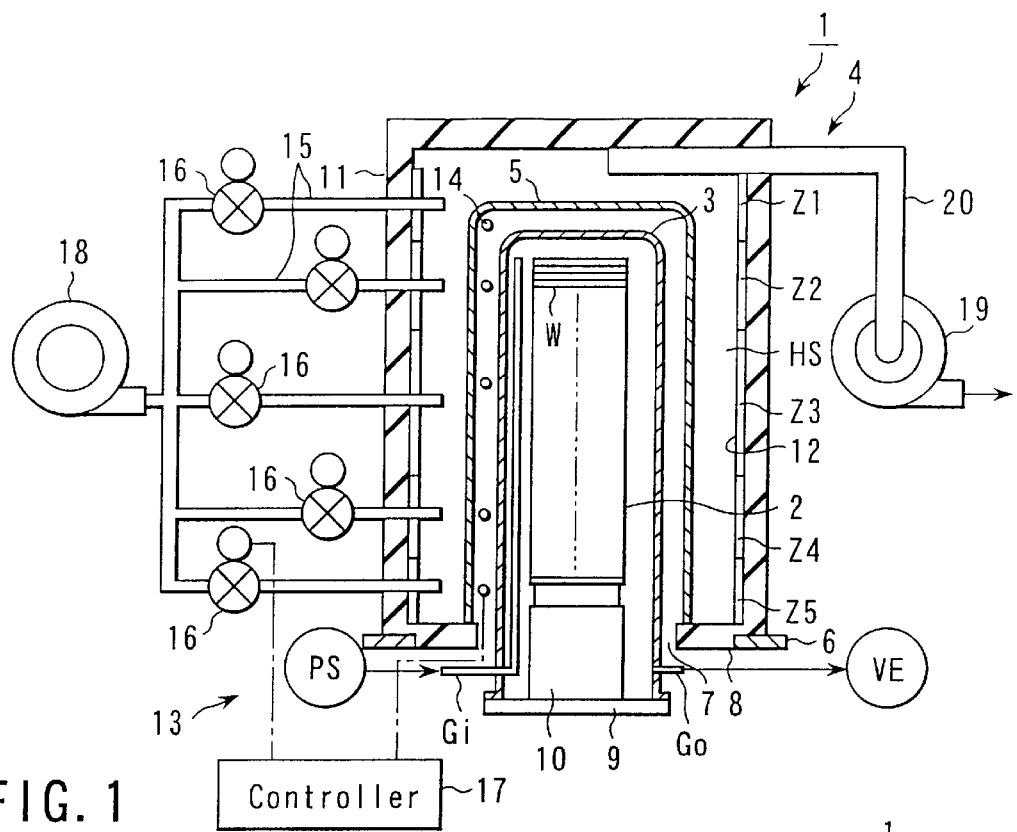
FIG. 1 is a structural view schematically showing a vertical heat-processing apparatus for processing semiconductor wafers according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a structural view schematically showing a vertical heat-processing apparatus for processing semiconductor wafers according to an embodiment of the present invention. The vertical heat-processing apparatus includes a vertical furnace 1, which functions as, e.g., a high-temperature furnace or diffusion furnace. The furnace 1 has a process chamber or process tube 3, and a cylindrical heating mechanism 4 with a liner tube (temperature-unifying tube) 5 interposed between the heating mechanism 4 and the process tube 3. A holder, such as a boat 2 made of quartz, is placed in the process tube 3. The boat 2 holds a number of, e.g., about 150, target substrates, i.e., semiconductor wafers W, such that they are stacked one on the other with a gap therebetween in a vertical direction. The heating mechanism 4 is arranged to surround the process tube 3, and to heat the interior of the process tube 3 through the sidewall of the tube 3 to a predetermined temperature of, e.g., from about 600 to 1,200° C.

The process tube 3 is made of a material, such as quartz, which is heat-resistant and corrosion-resistant, and has a cylindrical shape vertically elongated, with a closed top and an open bottom. The lower portion of the process tube 3 is connected to a gas supply line Gi for supplying a process gas or an inactive gas, and an exhaust line Go for exhausting the interior of the process tube 3. The gas supply line Gi is connected to a process gas supply section PS. The exhaust line Go is connected to a vacuum exhaust section VE including a vacuum pump, a pressure valve, and so forth. The process tube 3 may have a double-tube structure formed of inner and outer tubes.

The bottom end of the process tube 3 is supported by a base plate 6 through an attachment (not shown) disposed below the base plate 6. The base plate 6 is made of, e.g., stainless steel, and disposed horizontally in the casing of the vertical heat-processing apparatus. The base plate 6 is provided with an opening 7 formed therein, through which the process tube 3 is inserted in a vertical direction. A heat-insulating body 8 is attached to the opening 7 around the process tube 3 to prevent the opening 7 from allowing heat to be discharged.

A lid 9 made of, e.g., stainless steel is disposed below the process tube 3, to be movable up and down by an elevating mechanism (not shown) so as to close and open the bottom opening of the process tube 3. A boat 2 is mounted on the lid 9 via an insulating cylinder 10. The elevating mechanism is used to transfer the boat 2 into and out of the process tube 3 and to open and close the lid 9. The lid 9 is provided with a rotational mechanism (not shown) to rotate the boat 2 along with the insulating cylinder 10, so that the semiconductor wafers W are processed with a high planar uniformity.

The heating mechanism 4 includes a surrounding member 11, which is formed of a cylindrical heat-insulating body and forms a heating space HS around the process tube 3. A heater 12 comprising resistance heating wires is disposed on the inner face of the surrounding member 11 such that the wires meanderingly extend in the angular direction of the member 11 or spirally extend in the longitudinal direction of the member 11. The heating space HS consists of a plurality of zones, e.g., five zones Z1 to Z5, arrayed in a vertical direction, while the heater 12 consists of a plurality of heater segments respectively corresponding to the zones. The heater segments can be controlled independently of each other, so that a uniform heat process is performed over all the zones. The surrounding member 11 is covered with a water-cooling jacket (not shown). The heating mechanism 4 is placed on the base plate 6.

The liner tube 5 is made of, e.g., silicon carbide (SiC). The heating space HS is formed as a space substantially closed between the surrounding member 11 and the liner tube 5. The liner tube 5 improves uniformity in the heating temperature to the wafers W placed in the process tube 3. The liner tube 5 also prevents the wafers W from being contaminated with metals discharged from the resistance heating wires and the like of the heating mechanism 4. The liner tube 5 has a cylindrical shape vertically elongated, with a closed top and an open bottom. The liner tube 5 surrounds the process tube 3 and is placed on the heat-insulating body 8 of the base plate 6. The liner tube 5 may be omitted, such that a heating space HS is formed between the surrounding member 11 and the process tube (process chamber) 3.

The heating mechanism 4 is provided with a cooling mechanism 13, which forms a flow of cooling gas in each of the zones Z1 to Z5 of the heating space HS to cool the zones Z1 to Z5. The cooling mechanism 13 includes supply pipes 15, which respectively supply a cooling gas, such as air (clean air) to the zones Z1 to Z5 to cool them. The supply pipes 15 are connected to a common blower (supply blower) 18 for supplying the cooling gas. The distal ends of the supply pipes 15 penetrate the sidewall of the surrounding member 11 and come into the respective zones Z1 to Z5 of the heating space HS. The cooling mechanism 13 also includes a common exhaust pipe 20 connected to a blower (exhaust blower) 19 for exhausting the cooling gas from the heating space HS.

The supply pipes 15 are respectively provided with valves 16 to adjust supply rates of the cooling gas into the zones Z1 to Z5. Each of the valves 16 is formed of, e.g., a valve of the type driven by an actuator, whose opening degree is controlled by a controller 17. Temperature sensors 14 are arranged to detect temperatures respectively representing the zones Z1 to Z5 of the heating space HS. The temperature sensors 14 consist of, e.g., thermocouples, disposed between the process tube 3 and the liner tube 5 to respectively correspond to the zones Z1 to Z5. Each of the temperature sensors 14 may be inserted in and covered with a protection tube made of quartz.

The controller 17 is set to recognize as a reference value the cooling rate of a zone that has the highest cooling rate, when it controls the flow of the cooling gas. The reference value may be a fixed value, which has been obtained by experiment and the like in advance, and inputted into the controller 17. Instead, the reference value may be a non-fixed value, which is calculated at each time by the controller 17 on the basis of temperatures detected by the temperature sensors 14 during a cooling operation.

The controller 17 controls the opening degrees of the valves 16 of the supply pipes 15, on the basis of the temperatures corresponding to the zones Z1 to Z5, which are detected by the temperature sensors 14, so that the cooling rate of the heating space HS as a whole is adjusted to be the reference value. More specifically, the controller 17 controls, on the basis of the detected temperatures, the supply rate of cooling air to a zone having a lower cooling rate, such as the middle zones Z3, to be higher than that to a zone having the highest cooling rate, such as the lower zones Z5, so that the lower cooling rate is adjusted to be closer to, i.e., approximate, the highest cooling rate. In other words, the controller 17 controls the cooling mechanism 13 such that the flow velocity of the cooling gas in a first zone having a lower cooling rate becomes higher than the flow velocity of the cooling gas in a second zone having a higher cooling rate, thereby adjusting the cooling rate of the first zone to be closer to the cooling rate of the second zone.

An explanation will be given of a heat processing method in the vertical heat-processing apparatus shown in FIG. 1.

First, the boat 2, which has been loaded with wafers W, is placed on the insulating cylinder 10 supported by the lid 9 at a loading area below the heating mechanism 4. Then, the lid 9 is moved up by the elevating mechanism, so that the boat 2 is inserted into the process tube 3 through the bottom opening, which is then airtightly closed by the lid 9. Then, while the process tube 3 is exhausted, the wafers W on the boat 2 are heated up to a predetermined process temperature by the heating mechanism 4. Then, while the process tube 3 is exhausted, a predetermined process gas is supplied into the process tube 3 to subject the wafers W to a predetermined heat process, such as a diffusion process.

After the heat process ends, the heater 12 of the heating mechanism 4 is first turned off. Then, the blower 18 is operated to supply air used as a cooling gas through the supply pipes 15 into the heating space HS, so as to forcibly cool the interior of the heating space HS. At this time, the temperature sensors 14 detect temperatures representing the zones Z1 to Z5. The controller 17 controls, on the basis of the detected temperatures, the supply rate of cooling air to a zone having a lower cooling rate, such as the middle zones Z3, to be higher than that to a zone having the highest cooling rate, such as the lower zones Z5, so that the lower cooling rate is adjusted to be closer to the highest cooling rate. As a result, it is possible to prevent the cooling rates of the zones Z1 to Z5 from being uneven, and also to cause the cooling rates to be higher as a whole. Furthermore, as this method allows a flexible control oriented toward a decrease in temperature, the thermodynamics of the furnace 1 is improved.

Accordingly, the vertical heat-processing apparatus shown in FIG. 1 can automatically control the cooling rates of the zones Z1 to Z5 to be uniform under the control of the controller 17. In addition, the cooling rate of the heating space HS can be higher as a whole to improve the thermodynamics.

Figure 2:
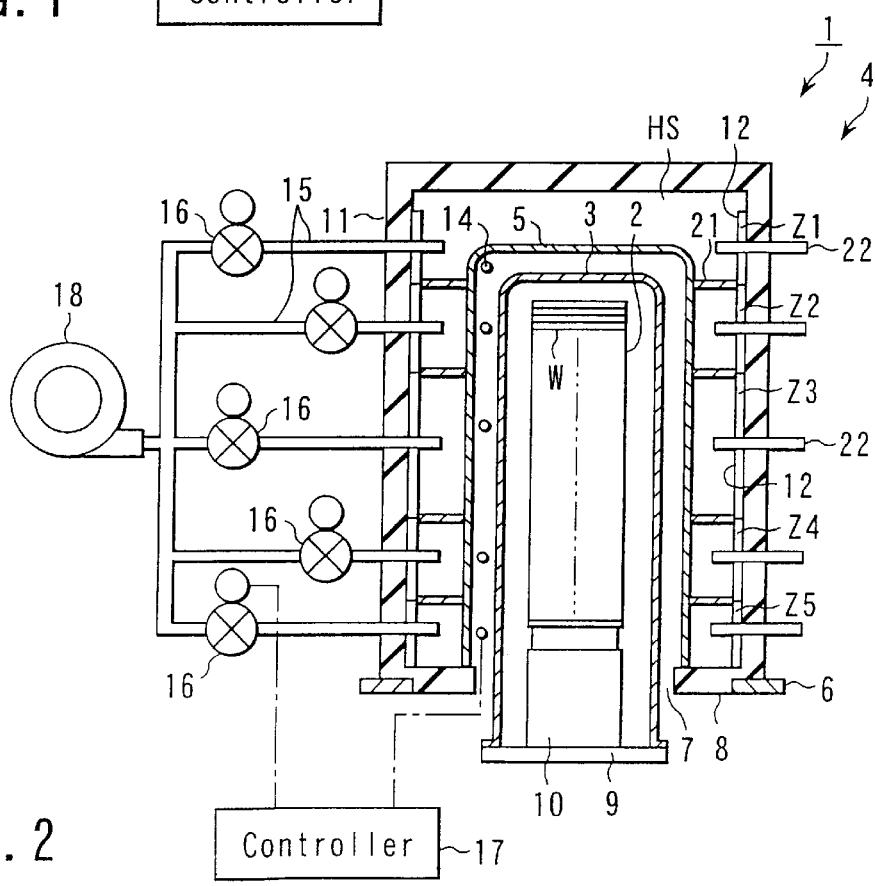
FIG. 2 is a structural view schematically showing a vertical heat-processing apparatus for processing semiconductor wafers according to another embodiment of the present invention.

FIG. 2 is a structural view schematically showing a vertical heat-processing apparatus for processing semiconductor wafers according to another embodiment of the present invention. This vertical heat-processing apparatus includes a heating space HS, which comprises zones Z1 to Z5 separated from each other by partitions 21 made of, e.g., quartz. The zones Z1 to Z5 are respectively provided with exhaust pipes 22 connected thereto, for exhausting a cooling gas independently of each other.

The vertical heat-processing apparatus shown in FIG. 2 can provide the same effect as the vertical heat-processing apparatus shown in FIG. 1. Furthermore, since the heating space HS is divided into the zones Z1 to Z5 by the partitions 21, the zones Z1 to Z5 can be cooled independently of each other. As in this embodiment, where the heating space HS is partitioned into the zones Z1 to Z5, it is possible to form a flow of the cooling gas only in a zone having a lower cooling rate so as to solve a temperature difference between the zones, in the case of not only the forcible cooling, but also natural cooling.

Figure 3:
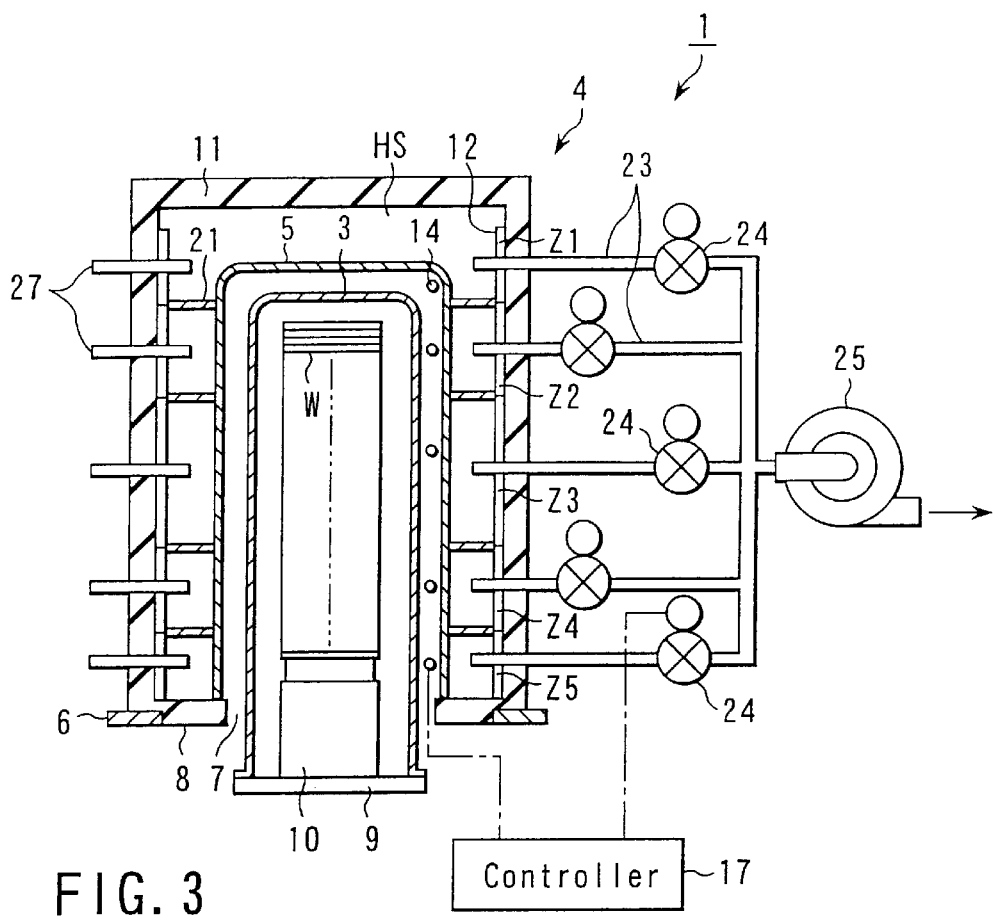
FIG. 3 is a structural view schematically showing a vertical heat-processing apparatus for processing semiconductor wafers according to still another embodiment of the present invention.
Figure 5:
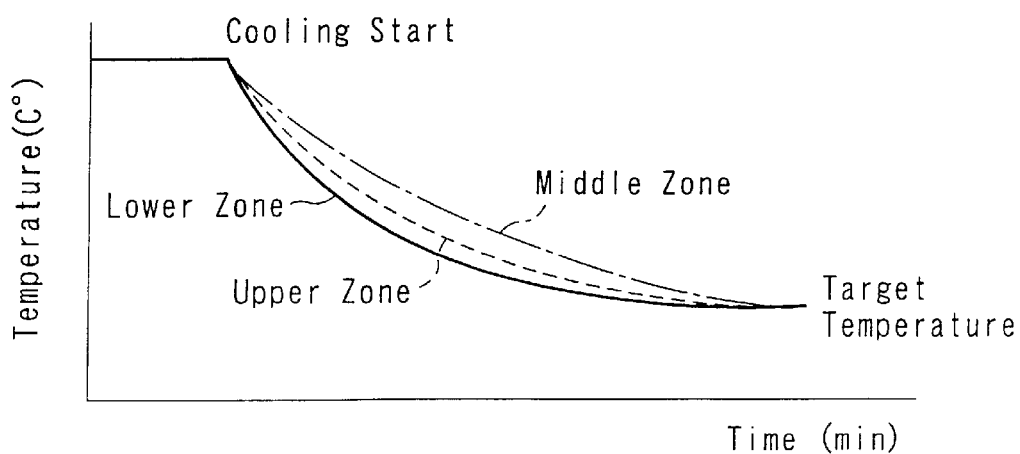
FIG. 5 is a graph showing the cooling rate of a heating space in a vertical heat-processing apparatus.

FIG. 3 is a structural view schematically showing a vertical heat-processing apparatus for processing semiconductor wafers according to still another embodiment of the present invention. This vertical heat-processing apparatus includes a heating space HS, which comprises zones Z1 to Z5 separated from each other by partitions 21 made of, e.g., quartz. The zones Z1 to Z5 are respectively provided with supply pipes 27 connected thereto, for supplying a cooling gas independently of each other, and exhaust pipes 23 connected thereto, for exhausting the cooling gas independently of each other. The exhaust pipes 23 are connected to a common blower (exhaust blower) 25.

The exhaust pipes 23 are respectively provided with valves 24 to adjust exhaust rates of the cooling gas from the zones Z1 to Z5. Each of the valves 24 is formed of, e.g., a valve of the type driven by an actuator, whose opening degree is controlled by a controller 17. Temperature sensors 14 are arranged to detect temperatures respectively representing the zones Z1 to Z5 of the heating space HS.

The controller 17 controls the opening degrees of the valves 24 of the exhaust pipes 23, on the basis of the temperatures corresponding to the zones Z1 to Z5, which are detected by the temperature sensors 14, so that the cooling rate of the heating space HS as a whole is adjusted to be a reference value corresponding to the highest cooling rate. More specifically, the controller 17 controls, on the basis of the detected temperatures, the exhaust rate of cooling air from a zone having a lower cooling rate, such as the middle zones Z3, to be higher than that from a zone having the highest cooling rate, such as the lower zones Z5, so that the lower cooling rate is adjusted to be closer to, i.e., approximate, the highest cooling rate. In other words, the controller 17 controls the cooling mechanism 13 such that the flow velocity of the cooling gas in a first zone having a lower cooling rate becomes higher than the flow velocity of the cooling gas in a second zone having a higher cooling rate, thereby adjusting the cooling rate of the first zone to be closer to the cooling rate of the second zone.

Accordingly, the vertical heat-processing apparatus shown in FIG. 3 can automatically control the cooling rates of the zones Z1 to Z5 to be uniform under the control of the controller 17. In addition, the cooling rate of the heating space HS can be higher as a whole to improve the thermodynamics.

Figure 4:
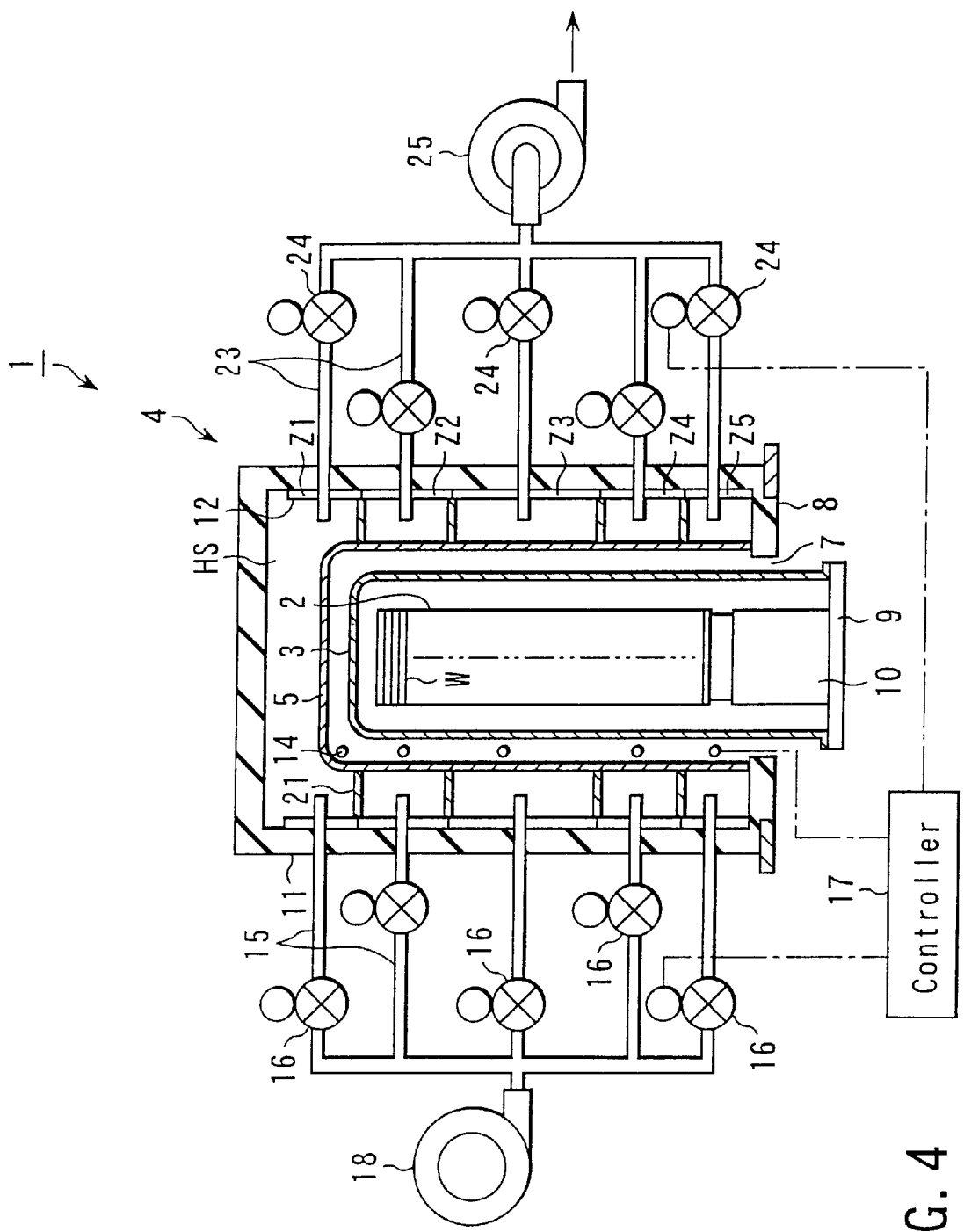
FIG. 4 is a structural view schematically showing a vertical heat-processing apparatus for processing semiconductor wafers according to still another embodiment of the present invention.

FIG. 4 is a structural view schematically showing a vertical heat-processing apparatus for processing semiconductor wafers according to still another embodiment of the present invention. This vertical heat-processing apparatus has a structure combining the features shown in FIG. 2 and the features shown in FIG. 3 with each other. More specifically, the vertical heat-processing apparatus includes a heating space HS, which comprises zones Z1 to Z5 separated from each other by partitions 21 made of, e.g., quartz. The zones Z1 to Z5 are respectively provided with supply pipes 15 connected thereto, for supplying a cooling gas independently of each other, and exhaust pipes 23 connected thereto, for exhausting the cooling gas independently of each other. The supply pipes 15 are connected to a common blower (supply blower) 18, and the exhaust pipes 23 are connected to a common blower (exhaust blower) 25.

The supply pipes 15 are respectively provided with valves 16 to adjust supply rates of the cooling gas into the zones Z1 to Z5. The exhaust pipes 23 are respectively provided with valves 24 to adjust exhaust rates of the cooling gas from the zones Z1 to Z5. The controller 17 controls the opening degrees of the valves 16 of the supply pipes 15 and the opening degrees of the valves 24 of the exhaust pipes 23, on the basis of the temperatures corresponding to the zones Z1 to Z5, which are detected by the temperature sensors 14, so that the cooling rate of the heating space HS as a whole is adjusted to be a reference value corresponding to the highest cooling rate.

Accordingly, the vertical heat-processing apparatus shown in FIG. 4 can more reliably achieve the advantages described with reference to the vertical heat-processing apparatuses shown in FIGS. 1 to 3, i.e., to prevent the cooling rates of the zones Z1 to Z5 from being uneven, and to control the cooling rate of the heating space HS to be higher as a whole.

In all the embodiments, the liner tube 5 may be omitted, wherein the heating space HS is formed between the surrounding member 11 and the process tube (process chamber) 3. A manifold made of a metal, such as stainless steel, and provided with a gas supply line and an exhaust line may be airtightly attached to the bottom of the process tube 3.

The present invention may be applied to a low-temperature furnace, such as a CVD furnace. The present invention may also be applied to a horizontal heat-processing apparatus in place of the vertical heat-processing apparatus. Furthermore, the present invention may be applied to a target substrate other than a semiconductor wafer, such as an LCD substrate, or a glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat-processing apparatus for a semiconductor process in which a plurality of target substrates are simultaneously subjected to a heat-process, the apparatus comprising:

a process chamber, which accommodates the target substrates;

a holder, which holds the target substrates with a gap therebetween in the process chamber;

a heater disposed around the process chamber, which heats an interior of the process chamber through a sidewall of the process chamber;

a surrounding member, which surrounds the process chamber and the heater, and forms a heating space around the process chamber, the heating space comprising a plurality of zones juxtaposed in a direction in which the target substrates are arrayed;

a plurality of the temperature sensors, which detect temperatures respectively representing the zones;

a cooling mechanism, which forms flows of a cooling gas respectively in the zones, and cools the zones; and a controller, which controls the cooling mechanism on the basis of temperatures detected by the temperature sensors when the process chamber is cooled, such that a flow velocity of the cooling gas in a first zone having a lower cooling rate becomes higher than a flow velocity of the cooling gas in a second zone having a higher cooling rate used as a reference, thereby adjusting the cooling rate of the first zone to be closer to the cooling rate of the second zone.

2. The apparatus according to claim 1, wherein the cooling mechanism comprises a plurality of supply pipes, which respectively supply the cooling gas to the zones to cool the zones, and a plurality of valves respectively arranged on the supply pipes to adjust supply rates of the cooling gas to the zones, and the controller adjusts opening degrees of the valves to control flow velocities of the cooling gas in the zones.

3. The apparatus according to claim 2, wherein the supply pipes are connected to a common blower, which supplies the cooling gas to the supply pipes.

4. The apparatus according to claim 2, wherein the cooling mechanism comprises a common exhaust pipe, which exhausts the cooling gas from all the zones.

5. The apparatus according to claim 2, wherein the cooling mechanism comprises a plurality of exhaust pipes, which respectively exhaust the cooling gas from the zones.

6. The apparatus according to claim 1, wherein the cooling mechanism comprises a supply pipe, which supplies the cooling gas to the zones to cool the zones, a plurality of exhaust pipes, which respectively exhaust the cooling gas from the zones, and a plurality of valves respectively arranged on the exhaust pipes to adjust exhaust rates of the cooling gas from the zones, and the controller adjusts opening degrees of the valves to control flow velocities of the cooling gas in the zones.

7. The apparatus according to claim 6, wherein the exhaust pipes are connected to a common blower, which exhausts the cooling gas from the exhaust pipes.

8. The apparatus according to claim 6, wherein the cooling mechanism comprises a plurality of supply pipes, which respectively supply the cooling gas to the zones to cool the zones.

9. The apparatus according to claim 1, wherein the zones are separated from each other by partitions disposed in the heating space.

10. The apparatus according to claim 1, further comprising an liner tube disposed between the process chamber and the surrounding member and surrounding the process chamber, such that the heating space is formed between the liner tube and surrounding member.

11. The apparatus according to claim 10, wherein the temperature sensors are disposed between the process chamber and the liner tube to respectively correspond to the zones.

12. The apparatus according to claim 1, wherein the reference value is inputted into the controller in advance.

13. The apparatus according to claim 1, wherein the reference value is calculated by the controller on the basis of temperatures detected by the temperature sensors when the process chamber is cooled.

14. The apparatus according to claim 1, wherein the holder holds the target substrates such that they are stacked one on the other with a gap therebetween in a vertical direction.

15. The apparatus according to claim 1, further comprising a supply section, which supplies the process gas into the process chamber and an exhaust section, which exhausts the process chamber.

16. A heat processing method in the apparatus according to claim 1, comprising:

subjecting the target substrates to a heat process, in which the target substrates are held by the holder in the process chamber, and heated by the heater;

performing, after the heat process, a cooling operation to cool the process chamber, in which the controller controls the cooling mechanism on the basis of temperatures detected by the temperature sensors, such that a flow velocity of the cooling gas in a first zone having a lower cooling rate becomes higher than a flow velocity of the cooling gas in a second zone having a higher cooling rate used as a reference, thereby adjusting the cooling rate of the first zone to be closer to the cooling rate of the second zone.

17. The method according to claim 16, wherein the cooling mechanism comprises a plurality of supply pipes, which respectively supply the cooling gas to the zones to cool the zones, and a plurality of valves respectively arranged on the supply pipes to adjust supply rates of the cooling gas to the zones, and the controller adjusts opening degrees of the valves to control flow velocities of the cooling gas in the zones.

18. The method according to claim 16, wherein the cooling mechanism comprises a supply pipe, which supplies the cooling gas to the zones to cool the zones, a plurality of exhaust pipes, which respectively exhaust the cooling gas from the zones, and a plurality of valves respectively arranged on the exhaust pipes to adjust exhaust rates of the cooling gas from the zones, and the controller adjusts opening degrees of the valves to control flow velocities of the cooling gas in the zones.

19. A vertical heat-processing apparatus for a semiconductor process in which a plurality of target substrates are simultaneously subjected to a heat-process, the apparatus comprising:

a process chamber, which accommodates the target substrates;

a supply section, which supplies the process gas into the process chamber;

an exhaust section, which exhausts the process chamber;

a holder, which holds the target substrates in the process chamber such that they are stacked one on the other with a gap therebetween in a vertical direction;

a heater disposed around the process chamber, which heats an interior of the process chamber through a sidewall of the process chamber;

a surrounding member, which surrounds the process chamber and the heater, and forms a heating space around the process chamber, the heating space comprising a plurality of zones juxtaposed in a vertical direction;

a plurality of the temperature sensors, which detect temperatures respectively representing the zones;

a cooling mechanism, which forms flows of a cooling gas respectively in the zones, and cools the zones, the cooling mechanism comprising a plurality of supply pipes, which respectively supply the cooling gas to the zones to cool the zones, a plurality of valves respec tively arranged on the supply pipes to adjust supply rates of the cooling gas to the zones, and an exhaust pipe, which exhausts the cooling gas from the zones; and a controller, which adjusts opening degrees of the valves on the basis of temperatures detected by the temperature sensors when the process chamber is cooled, such that a flow velocity of the cooling gas in a first zone having a lower cooling rate becomes higher than a flow velocity of the cooling gas in a second zone having a higher cooling rate used as a reference, thereby adjusting the cooling rate of the first zone to be closer to the cooling rate of the second zone.

20. The apparatus according to claim 19, further comprising a liner tube disposed between the process chamber and the surrounding member and surrounding the process chamber, such that the heating space is formed between the liner tube and surrounding member.

* * * * *

UNITED STATES PATENT AND TRADEMARK OFFICE
CERTIFICATE OF CORRECTION

PATENT NO.     : 6,403,927 B1
DATED          : June 11, 2002
INVENTOR(S)    : Kato It is certified that error appears in the above-identified patent and that said Letters Patent is hereby corrected as shown below:

<u>Title page, Item [54] and Column 1, lines 1 and 2,</u>
Should read:

-- [54]  HEAT-PROCESSING APPARATUS AND METHOD FOR SEMICONDUCTOR PROCESS --

Signed and Sealed this

Twenty-first Day of January, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,403,927 B1
DATED         : June 11, 2002
INVENTOR(S)   : Kato

It is certified that error appears in the above-identified patent and that said Letters Patent is hereby corrected as shown below:

<u>Title page,</u>
Item [73], Assignee, should read:
-- [73] Assignee: Tokyo Electron Limited,
                  Tokyo (JP) --

Signed and Sealed this

Eleventh Day of May, 2004

JON W. DUDAS
*Acting Director of the United States Patent and Trademark Office*